United States Patent
Lee et al.

(10) Patent No.: US 10,103,269 B2
(45) Date of Patent: Oct. 16, 2018

(54) THIN-FILM TRANSISTOR SUBSTRATE HAVING A LIGHT REFLECTION REDUCTION LAYER AND DISPLAY DEVICE COMPRISING SAME

(71) Applicant: LG CHEM, LTD., Seoul (KR)

(72) Inventors: Ilha Lee, Daejeon (KR); Ji Young Hwang, Daejeon (KR); Seung Heon Lee, Daejeon (KR); Dong Hyun Oh, Daejeon (KR); Ki-Hwan Kim, Daejeon (KR); Han Min Seo, Daejeon (KR); Chan Hyoung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/552,750

(22) PCT Filed: May 9, 2016

(86) PCT No.: PCT/KR2016/004801
§ 371 (c)(1),
(2) Date: Aug. 22, 2017

(87) PCT Pub. No.: WO2016/182282
PCT Pub. Date: Nov. 17, 2016

(65) Prior Publication Data
US 2018/0033893 A1  Feb. 1, 2018

(30) Foreign Application Priority Data

May 8, 2015 (KR) .................. 10-2015-0064822

(51) Int. Cl.
*H01L 29/786* (2006.01)
*C23C 14/18* (2006.01)
(Continued)

(52) U.S. Cl.
CPC .... *H01L 29/78633* (2013.01); *C23C 14/0015* (2013.01); *C23C 14/0676* (2013.01); *C23C 14/185* (2013.01); *C23C 14/34* (2013.01); *G02F 1/1368* (2013.01); *G02F 1/13439* (2013.01); *G02F 1/133502* (2013.01); *G02F 1/136286* (2013.01); *H01L 27/124* (2013.01); *H01L 29/786* (2013.01); *G02F 2001/136295* (2013.01); *H01L 29/45* (2013.01);
(Continued)

(58) Field of Classification Search
CPC . H01L 29/78633; H01L 27/124; H01L 29/45; H01L 29/7869; H01L 29/78669; H01L 29/78678; H01L 29/4908; C23C 14/34; C23C 14/185; G02F 1/1368; G02F 1/13439; G02F 1/133502; G02F 1/136286
See application file for complete search history.

(56) References Cited

U.S. PATENT DOCUMENTS 9,812,581 B2 * 11/2017 Kitakado ............... H01L 29/45
2012/0181532 A1 * 7/2012 Lin ..................... H01L 29/7869
257/43
2013/0043475 A1 2/2013 Kim et al.

FOREIGN PATENT DOCUMENTS

JP  10-307296 A  11/1998
JP  2001-281645 A  10/2001
(Continued)

*Primary Examiner* — Bilkis Jahan
(74) *Attorney, Agent, or Firm* — Dentons US LLP

(57) ABSTRACT

The present specification relates to a thin-film transistor substrate and a display device including the same.

8 Claims, 9 Drawing Sheets

(51) Int. Cl.
*C23C 14/34* (2006.01)
*G02F 1/1335* (2006.01)
*G02F 1/1343* (2006.01)
*G02F 1/1362* (2006.01)
*G02F 1/1368* (2006.01)
*H01L 27/12* (2006.01)
*C23C 14/00* (2006.01)
*C23C 14/06* (2006.01)
*H01L 29/45* (2006.01)
*H01L 29/49* (2006.01)

(52) U.S. Cl.
CPC ...... *H01L 29/4908* (2013.01); *H01L 29/7869* (2013.01); *H01L 29/78618* (2013.01); *H01L 29/78669* (2013.01); *H01L 29/78678* (2013.01)

(56) References Cited

FOREIGN PATENT DOCUMENTS

| | | |
|---|---|---|
| JP | 2012-230326 A | 11/2012 |
| KR | 10-0897739 B1 | 5/2009 |
| KR | 10-2013-0019700 A | 2/2013 |

\* cited by examiner

[Figure 1]
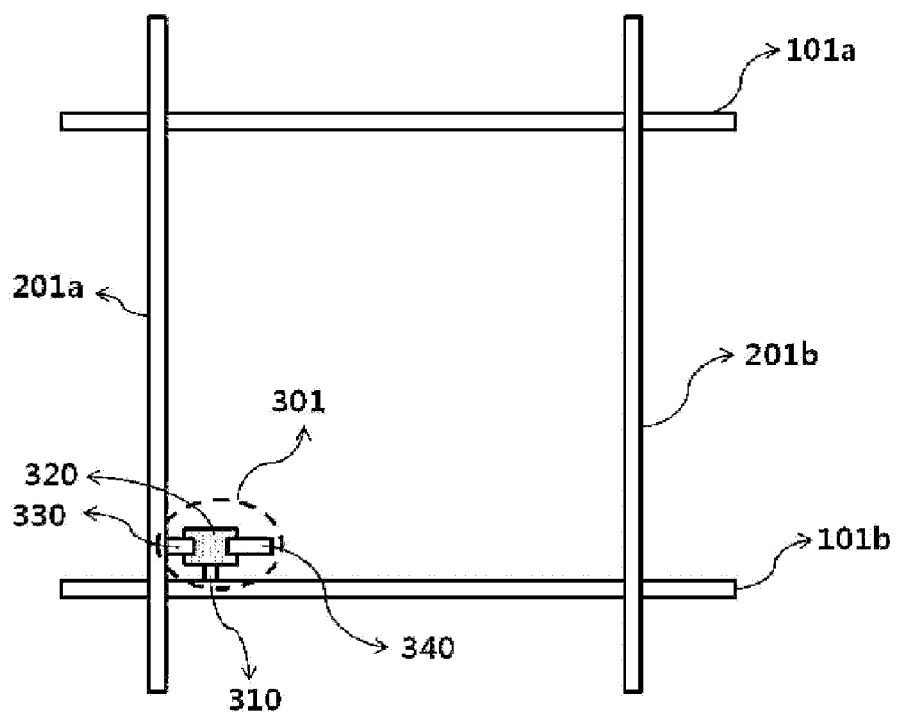

[Figure 2]
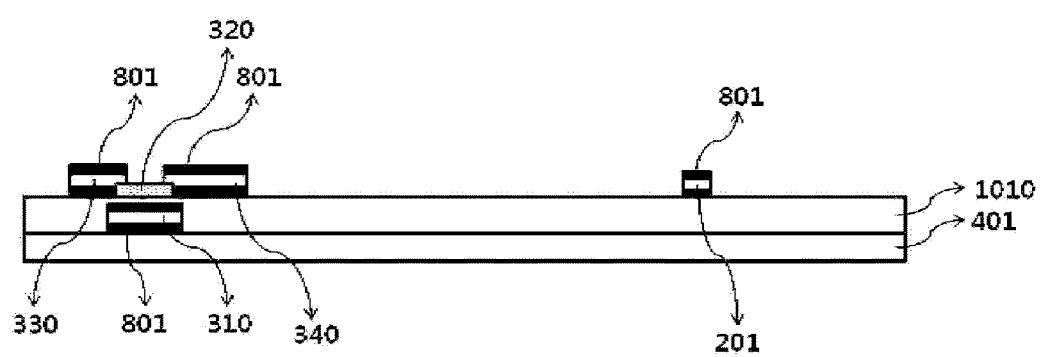

[Figure 3]
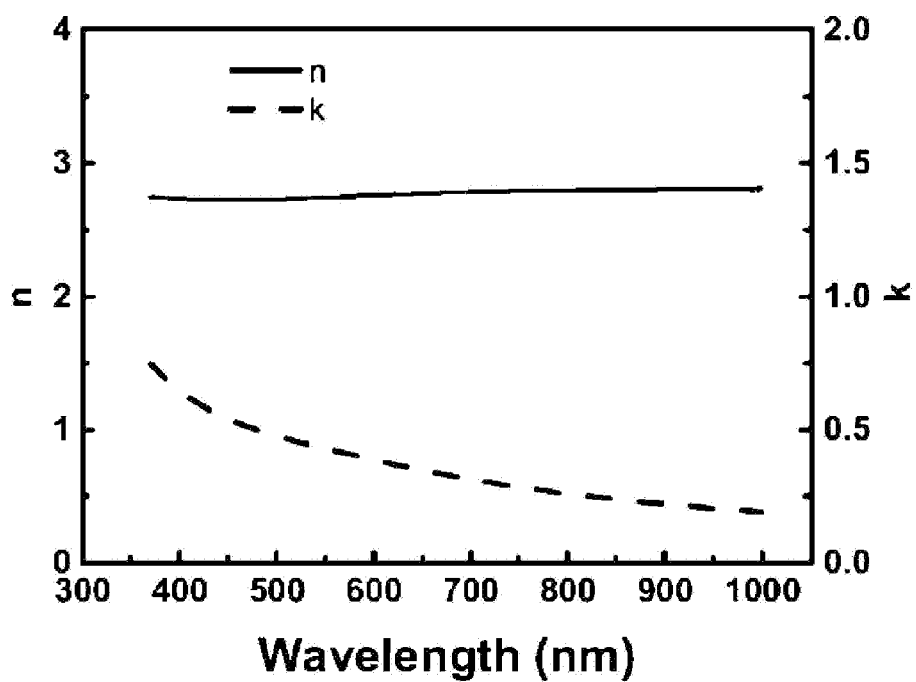

[Figure 4]
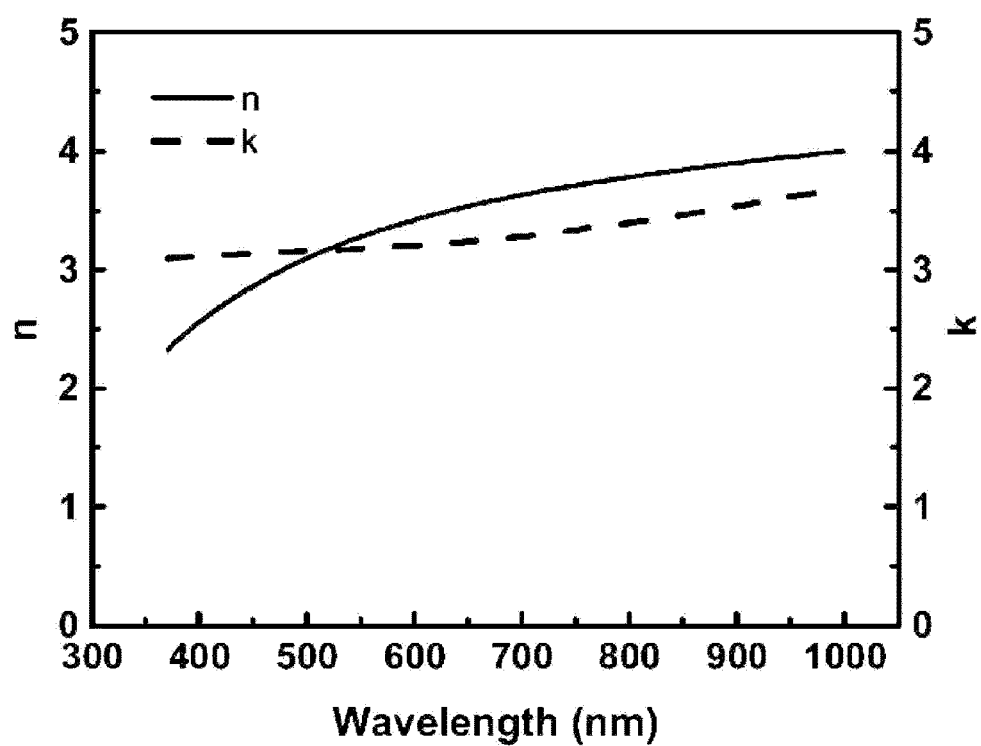

[Figure 5]
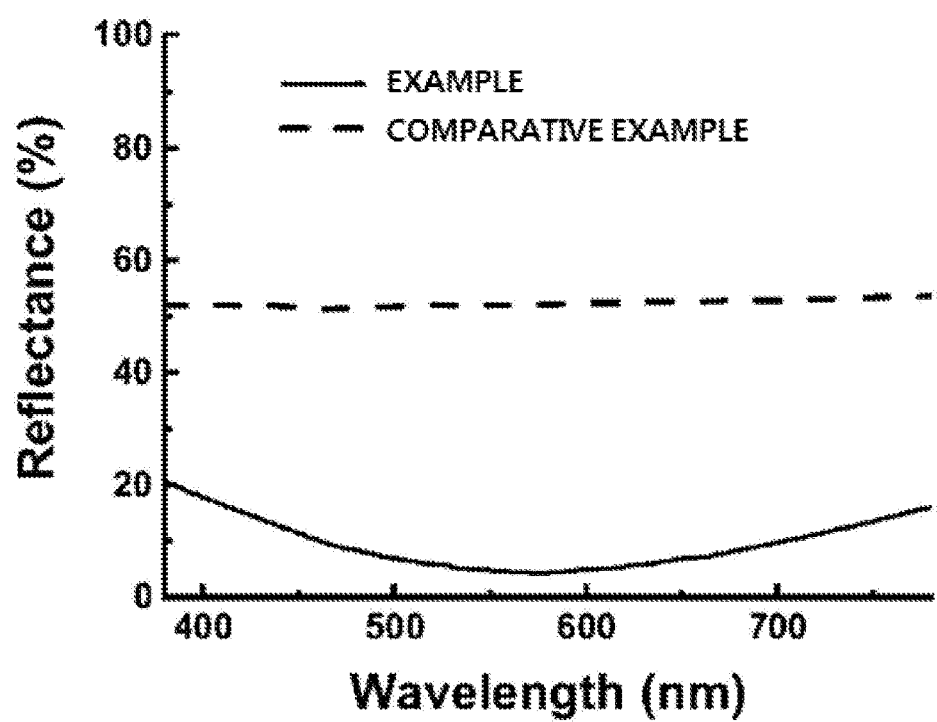

[Figure 6]
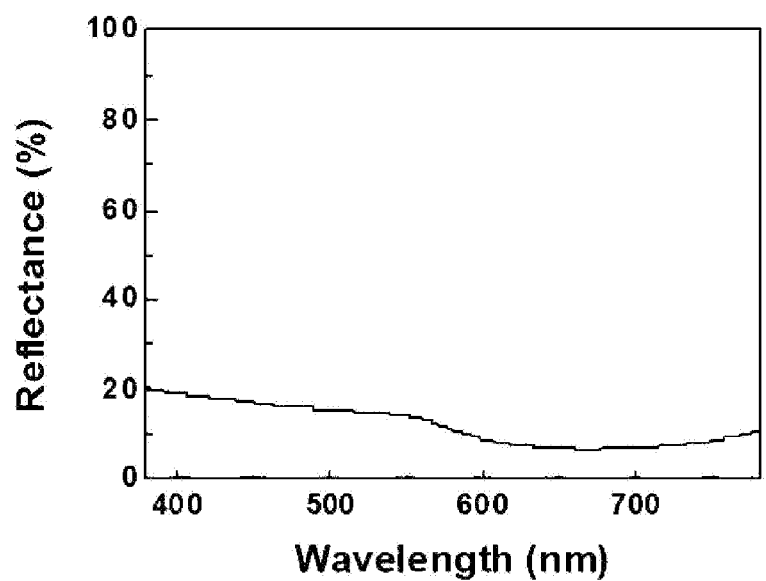

[Figure 7]
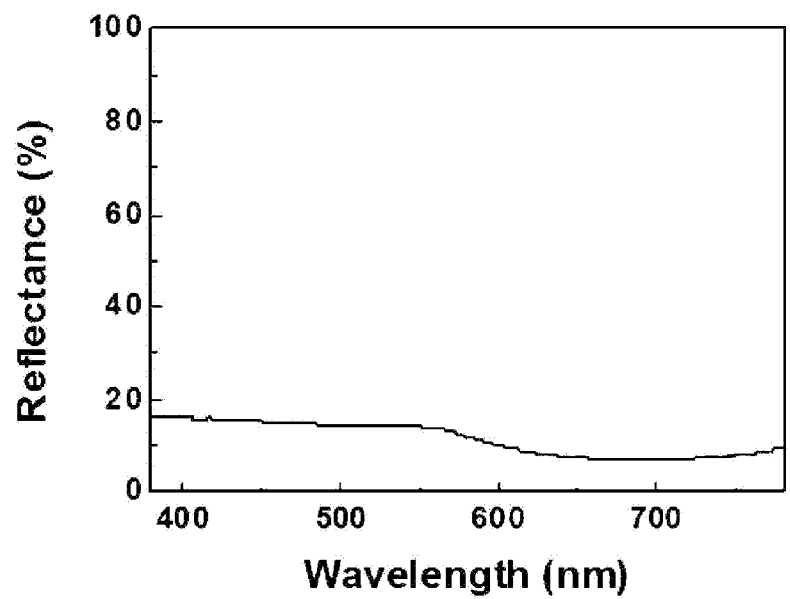

[Figure 8]
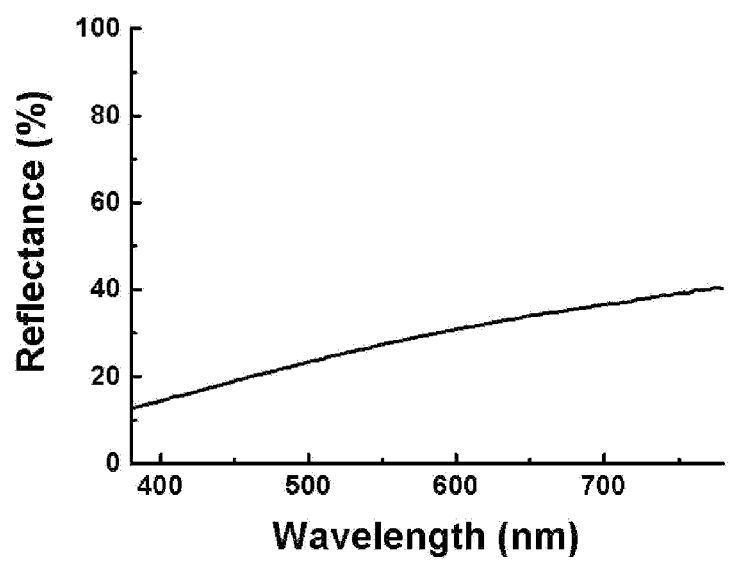

[Figure 9]
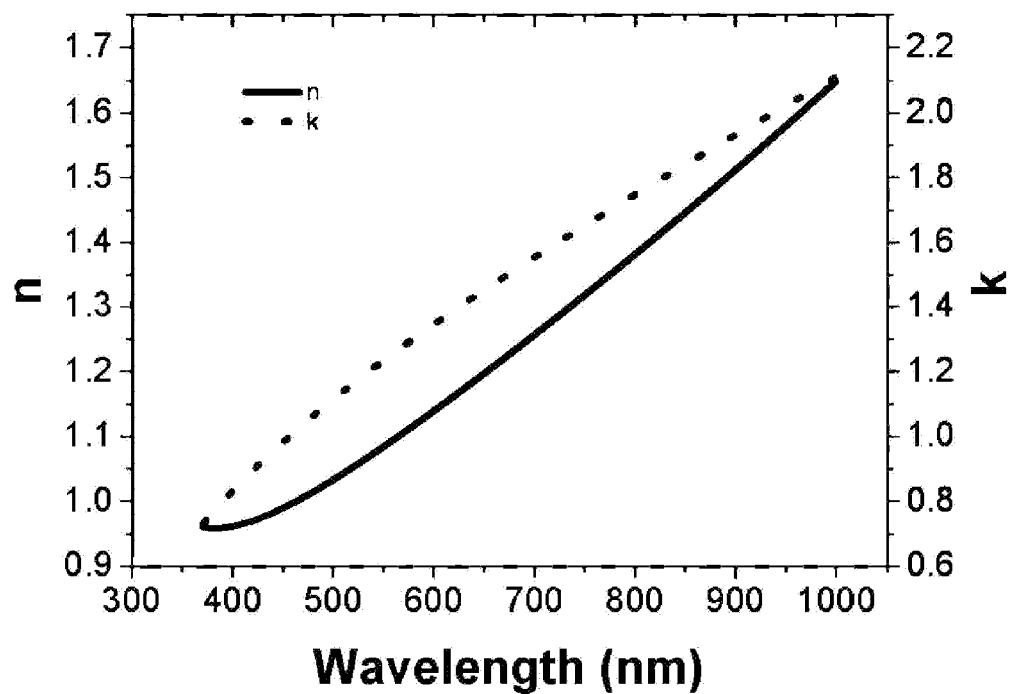

THIN-FILM TRANSISTOR SUBSTRATE HAVING A LIGHT REFLECTION REDUCTION LAYER AND DISPLAY DEVICE COMPRISING SAME

TECHNICAL FIELD

This application is a National Stage Application of International Application No. PCT/KR2016/004801 filed on May 9, 2016, which claims the benefit of Korean Patent Application No. 10-2015-0064822 filed on May 8, 2015, all of which are hereby incorporated by reference in their entirety for all purposes as if fully set forth herein.

The present specification relates to a thin-film transistor substrate and a display device including the same.

BACKGROUND ART

A thin-film transistor (TFT) as a transistor formed by sequentially depositing a semiconductor, an insulator, a metallic thin film, and the like on a substrate is developed and commercialized in various fields including peripheral elements including a liquid crystal display, a laser printer head, and the like and image sensors including a scanner, and the like by using an advantage in that the TFT may be formed on a large-area substrate.

Among them, the display element needs to implement a high contrast ratio, a high resolution, color displayability, high-speed responsiveness, an optical viewing angle, and the like and a passive matrix type device is difficult to enhance all of the characteristics and has a problem of signal crosstalk, but the TFT which is a switching element is added to each pixel, thereby enhancing display performance in overall.

However, since the TFT and a wire electrode connected therewith have metal-specific high light reflectance, there is a problem that a glaring phenomenon occurs in the display element.

DETAILED DESCRIPTION OF THE INVENTION

Technical Problem

The present specification provides a thin-film transistor substrate which may be applied to a display device capable of preventing a glaring phenomenon of a wire electrode and a display device comprising the same.

Technical Solution

An embodiment of the present specification provides a thin-film transistor substrate comprising: a substrate; multiple gate lines and multiple data lines provided on the substrate to cross each other; a thin-film transistor comprising a gate electrode connected with the gate line, a semiconductor layer provided on the gate electrode to be insulated from the gate electrode, a source electrode electrically connected with the data line, and a drain electrode; and a light reflection reduction layer provided on a plane of the gate electrode, the source electrode, the drain electrode, the gate line, and the data line, which faces the substrate and a plane opposite to the plane of the gate electrode, the source electrode, the drain electrode, the gate line, and the data line facing the substrate, in which in the light reflection reduction layer, a value of Equation 1 given below satisfies 0.004 or more and 0.22 or less.

$$\frac{(k \times t)}{\lambda} \qquad \text{[Equation 1]}$$

In Equation 1, k represents an extinction coefficient of the light reflection reduction layer, t represents a thickness of the light reflection reduction layer, and λ represents a wavelength of light.

An embodiment of the present specification provides a display device including the thin-film transistor substrate.

Advantageous Effects

A thin-film transistor substrate according to an embodiment of the present specification controls light reflectance by a wire electrode formed on a substrate to implement a high-image quality display.

Further, the thin-film transistor substrate according to the embodiment of the present specification may be applied to both a bottom emission structure display device and a top emission structure display device.

BRIEF DESCRIPTION OF DRAWINGS

FIG. 1 illustrates one area of a plan view of a thin-film transistor substrate according to an embodiment of the present specification.

FIG. 2 illustrates a cross-section of the thin-film transistor substrate according to the embodiment of the present specification.

FIG. 3 is a graph illustrating n and k values depending on a wavelength of a light reflection reduction layer according to Example 1.

FIG. 4 is a graph illustrating n and k values depending on the wavelength of a MoTi layer according to Comparative Example 1.

FIG. 5 illustrates comparison of reflectance of Example 1 and reflectance of Comparative Example 1.

FIG. 6 illustrates reflectance of Example 13.

FIG. 7 illustrates reflectance of Example 14.

FIGS. 8 and 9 illustrate reflectance and an optical constant value implemented in a structure manufactured in Example 15.

BEST MODE

In the present specification, when it is described that a member is positioned on another member, the member may "contact" the other member or a third member may be interposed between both members.

In the present specification, unless explicitly described to the contrary, the word "comprise" and variations such as "comprises" or "comprising", will be understood to imply the inclusion of stated elements but not the exclusion of any other elements.

Hereinafter, the present specification will be described in more detail.

In the present specification, a display device as a term which collectively refers to a TV or a computer monitor includes a display element that forms an image and a case that supports the display element.

In a conventional display device, a black matrix has been applied to prevent light reflection, light leakage, and the like. In recent years, a structure that does not use the aforementioned black matrix has been developed by introducing a structure called a color filter on TFT array (COT or COA) in which a color filter is formed on an array substrate together with a thin-film transistor. With the introduction of the structure that does not use the black matrix, it is possible to obtain the effects of enhancing transmissivity of the display device, enhancing luminance, and improving backlight efficiency. However, in the case of the structure without the black matrix, regions in which metal electrodes included in the display device may be exposed are increased, which causes problems due to color and reflection characteristics of the metal electrodes. Particularly, in recent years, the display device has been increased in size and has been increased in resolution, so that a technology capable of reducing the reflection and color characteristics by the metal electrode included in the display device is required.

Therefore, the present inventors have found a fact that in a display device including a conductive layer such as metal, visibility of the conductive layer exerts a major influence on light reflection and diffraction characteristics of the conductive layer and have intended to improve the fact.

A liquid crystal display device according to an embodiment of the present specification introduces a light reflection reduction layer on wire electrodes including a gate electrode, a source electrode, a drain electrode, a gate line, and a data line to significantly improve deterioration in visibility depending on high reflectance of the wire electrode.

Furthermore, in the case of using the light reflection reduction layer, there is an advantage in that the black matrix may not be formed in a region corresponding to a thin-film transistor.

In detail, since the light reflection reduction layer has a light absorbing property, the amount of light incident in the wire electrode itself and the amount of light reflected from a pixel electrode and a common electrode are reduced, thereby reducing the light reflectance by the wire electrode.

A thin-film transistor substrate according to an embodiment of the present specification comprises: a substrate; multiple gate lines and multiple data lines provided on the substrate to cross each other; a thin-film transistor comprising a gate electrode connected with the gate line, a semiconductor layer provided on the gate electrode to be insulated from the gate electrode, a source electrode electrically connected with the data line, and a drain electrode; and a light reflection reduction layer provided on a plane of the gate electrode, the source electrode, the drain electrode, the gate line, and the data line, which faces the substrate and a plane opposite to the plane of the gate electrode, the source electrode, the drain electrode, the gate line, and the data line facing the substrate, in which in the light reflection reduction layer, in which in the light reflection reduction layer, a value of Equation 1 given below satisfies 0.004 or more and 0.22 or less.

$$\frac{(k \times t)}{\lambda} \quad \text{[Equation 1]}$$

In Equation 1, k represents an extinction coefficient of the light reflection reduction layer, t represents a thickness of the light reflection reduction layer, and λ represents a wavelength of light.

An embodiment of the present specification provides a display device including the thin-film transistor substrate.

When external light is incident in an electrode having the light reflection reduction layer, primary reflection light exists, which is reflected on the surface of the light reflection reduction layer and secondary reflection light exists, which is reflected on a lower electrode surface through the light reflection reduction layer.

The light reflection reduction layer may reduce the light reflectance through extinction interference between the primary reflection light and the secondary reflection light.

The present inventors have found that when the light reflection reduction layer in which a value of Equation 1 satisfies 0.004 to 0.22 is provided in contact with the pixel electrode and the common electrode, the light reflectance of the pixel electrode and the common electrode is innovatively reduced through the extinction interference, thereby implementing high resolution of a display.

In detail, a condition in which the primary reflection light and the secondary reflection light have a phase difference of 180 degrees to cause the extinction interference is represented in Equation 2 given below.

$$t = \frac{\lambda}{4 \cdot n} \times N \quad \text{[Equation 2]}$$

In Equation 2 given above, t represents a thickness of the light reflection reduction layer, λ represents a wavelength of light, n represents a refractive index of the light reflection reduction layer, and N represents predetermined odd numbers such as 1, 3, and 5.

Primary reflectance under the condition which causes the extinction interference may be obtained as shown in Equation 3 given below.

$$R_1 = \left[\frac{(n-1)^2 + k^2}{(n+1)^2 + k^2}\right] \quad \text{[Equation 3]}$$

In Equation 3, n represents the refractive index of the light reflection reduction layer and k represents an extinction coefficient of the light reflection reduction layer.

Furthermore, secondary reflectance under the condition which causes the extinction interference may be obtained as shown in Equation 4 given below.

$$R_2 = R_{metal}(1 - R_1)I_0 \exp\left(-\frac{2\pi}{n} \cdot k \cdot N\right) \quad \text{[Equation 4]}$$

In Equation 4, $R_{metal}$ represents the reflectance of the surface of a pixel electrode or a common electrode, $R_1$ represents the primary reflectance in the light reflection reduction layer, $I_o$ represents the intensity of incident light, n represents the refractive index of the light reflection reduction layer, k represent the extinction coefficient of the light reflection reduction layer, and N represents predetermined odd numbers such as 1, 3, and 5.

According to an embodiment of the present specification, an absolute value of a difference between the primary reflectance and the secondary reflectance may be in the range of 0.13 to 0.42.

According to an embodiment of the present specification, the λ may be 550 nm. That is, the λ may be light having a wavelength of 550 nm.

According to an embodiment of the present specification, the gate electrode, the source electrode, the drain electrode, the gate line, and the data line may be collectively referred to as the wire electrode.

According to an embodiment of the present specification, since the light reflection reduction layer is provided on a plane of the wire electrode facing the substrate, when the thin-film transistor substrate is applied to a bottom emission structure display device, a glaring phenomenon depending on the wire electrode may be controlled.

Further, according to an embodiment of the present specification, since the light reflection reduction layer is provided on a plane opposite to the plane of the wire electrode facing the substrate, when the thin-film transistor substrate is applied to a top emission structure display device, the glaring phenomenon depending on the wire electrode may be controlled.

That is, according to an embodiment of the present specification, the thin-film transistor substrate is advantageous in that the thin-film transistor substrate may be applied to both the bottom emission structure display device and the top emission structure display device.

According to an embodiment of the present specification, a thickness of the light reflection reduction layer may be in the range of 5 nm to 100 nm and more preferably in the range of 10 nm to 100 nm. In detail, according to an embodiment of the present specification, the thickness of the light reflection reduction layer may be in the range of 20 nm to 60 nm.

When the thickness of the light reflection reduction layer is less than 10 nm, a problem that the light reflectance of the wire electrode may not be sufficiently controlled may occur. Further, when the thickness of the light reflection reduction layer is more than 100 nm, a problem that it is difficult to pattern the light reflection reduction layer may occur.

According to an embodiment of the present specification, an extinction coefficient k of the light reflection reduction layer may be in the range of 0.1 to 2 in the light having the wavelength of 550 nm. In detail, according to an embodiment of the present specification, the extinction coefficient k of the light reflection reduction layer may be in the range of 0.4 to 2 in the light having the wavelength of 550 nm.

When the extinction coefficient is within the range, the light reflectance of the wire electrode may be effectively controlled, and as a result, the visibility of the liquid crystal display device may be even more enhanced.

The extinction coefficient may be measured by using Ellipsometer measurement equipment, and the like known to the art.

The extinction coefficient k may also be referred to as an absorption coefficient and may be a scale to define how strong a target material absorbs light in a specific wavelength. As a result, primary absorption occurs according to a degree of k while the incident light passes through the light reflection reduction layer having the thickness of t, and secondary absorption occurs and thereafter, external reflection occurs while the light reflected by a lower electrode layer passes through the light reflection reduction layer having the thickness of t again. Accordingly, the thickness of the light reflection reduction layer and the value of the absorption coefficient serve as key factors which influence total reflectance. Therefore, according to an embodiment of the present specification, an area capable of reducing light reflection within predetermined ranges of the absorption coefficient k and the thickness t of the light reflection reduction layer is shown through Equation 1.

According to an embodiment of the present specification, the refractive index n of the light reflection reduction layer may be in the range of 2 to 3 in the light having the wavelength of 550 nm.

The primary reflection occurs in a material of the light reflection reduction layer having the extinction coefficient k and the refractive index n and in this case, the key factors for determining the primary reflection are the refractive index n and the absorption coefficient k. Therefore, the refractive index n and the absorption coefficient k are closely related with each other and the effect may be maximized within the range.

According to an embodiment of the present specification, the light reflectance of the wire electrode including the light reflection reduction layer may be 50% or less and more preferably, 40% or less.

According to an embodiment of the present specification, the light reflection reduction layer may include at least one selected from a group consisting of metal oxide, metal nitride, and metal oxynitride. In detail, according to an embodiment of the present specification, the light reflection reduction layer may include at least one selected from the group consisting of metal oxide, metal nitride, and metal oxynitride as a main material.

According to an embodiment of the present specification, the metal oxide, the metal nitride, and the metal oxynitride may be derived from one or two or more metals selected from a group consisting of Cu, Al, Mo, Ti, Ag, Ni, Mn, Au, Cr, and Co.

According to an embodiment of the present specification, the light reflection reduction layer may include a material selected from a group consisting of copper oxide, copper nitride, and copper oxynitride.

According to an embodiment of the present specification, the light reflection reduction layer may include a material selected from a group consisting of aluminum oxide, aluminum nitride, and aluminum oxynitride.

According to an embodiment of the present specification, the light reflection reduction layer may include copper-manganese oxide.

According to an embodiment of the present specification, the light reflection reduction layer may include copper-manganese oxynitride.

According to an embodiment of the present specification, the light reflection reduction layer may include copper-nickel oxide.

According to an embodiment of the present specification, the light reflection reduction layer may include copper-nickel oxynitride.

According to an embodiment of the present specification, the light reflection reduction layer may include molybdenum-titanium oxide.

According to an embodiment of the present specification, the light reflection reduction layer may include molybdenum-titanium oxynitride.

According to an embodiment of the present specification, the light reflection reduction layer may be constituted by a single layer or two or more of multiple layers. The light reflection reduction layer preferably shows an achromatic color, but is not particularly limited thereto. In this case, the achromatic color means a color shown when light incident in the surface of an object is not selectively absorbed, but evenly reflected and absorbed with respect to wavelengths of respective components.

FIG. 1 illustrates one area of a plan view of a thin-film transistor substrate according to an embodiment of the present specification. In detail, FIG. 1 illustrates a pixel area partitioned by multiple gate lines 101a and 101b and multiple data lines 201a and 201b provided on the substrate and a thin-film transistor 301 provided in the pixel area. Further, a gate line 101b in the pixel area is connected with a gate electrode 310, a data line 201a is connected with a source electrode 300, and a drain electrode 340 is connected with a common electrode (not illustrated) or a pixel electrode (not illustrated) in the pixel area when being applied to the display device.

The pixel area means an area partitioned by the gate line and the data line when the thin-film transistor substrate is applied to the display device.

FIG. 2 illustrates a cross-section of the thin-film transistor substrate according to the embodiment of the present specification. In detail, the thin-film transistor 301 which is constituted by the gate electrode 310, the semiconductor layer 320, the source electrode 330, and the drain electrode 340 is provided on the substrate, and the thin-film transistor 301 may be partitioned as the pixel area by the gate line (not illustrated) and the data line 201 connected with the gate electrode when being applied to the display device. Further, the gate electrode 310 and the semiconductor layer 320 may be insulated by an insulating layer 1010. The insulating layer 1010 may be a gate insulating layer. Further, a light reflection reduction layer 801 is provided on the top and the bottom of the gate electrode 310, the source electrode 330, the drain electrode 340, the gate line (not illustrated), and the data line 201. In FIG. 2, each of layers filled with a black color, which are provided on the top and the bottom of the gate electrode 310, the source electrode 330, the drain electrode 340, the gate line (not illustrated), and the data line 201 means the light reflection reduction layer 801.

According to an embodiment of the present specification, the thin-film transistor comprises a gate electrode branched from the gate line and a semiconductor layer provided on the gate electrode with an insulting layer interposed therebetween. Furthermore, the semiconductor layer is connected with a source electrode and a drain electrode with an ohmic contact layer interposed therebetween and the source electrode is connected with the data line.

The gate line supplies a scan signal from a gate driver and the data line supplies a video signal from a data driver.

According to an embodiment of the present specification, the gate electrode and the gate line may be provided on the substrate and a gate insulating layer may be provided on the gate electrode and the gate line. Furthermore, the semiconductor layer, the source electrode, the drain electrode, and the data line may be provided on the gate insulating layer.

Further, according to an embodiment of the present specification, the semiconductor layer, the source electrode, the drain electrode, and the data line may be provided on the substrate and the gate insulating layer may be provided on the semiconductor layer, the source electrode, the drain electrode, and the data line. Furthermore, the gate electrode and the gate line may be provided on the gate insulating layer.

In detail, the gate insulating layer may serve to insulate the gate electrode and the semiconductor layer.

According to an embodiment of the present specification, the gate insulating layer may include at least one selected from a group consisting of silicon nitride (SiNx), silicon oxide ($SiO_2$), aluminum oxide ($Al_2O_3$), Bismuth-Zinc-Niobium (BZN) oxide, titanium oxide, hafnium oxide, zirconium oxide, tantalum oxide, and lanthanum oxide.

According to an embodiment of the present specification, the semiconductor layer may include silicon and/or silicon oxide. In detail, the semiconductor layer may include amorphous Si and/or low temperature poly-silicon (LIPS).

Further, according to an embodiment of the present specification, the semiconductor layer may include at least one selected from a group consisting of zinc oxide (ZnO), tin oxide (SnO), indium oxide (InO), indium-tin oxide (ITO), zinc-tin oxide (ZTO), indium-gallium-zinc oxide (IGZO), zinc-aluminum oxide (ZAO) molybdenum sulfide ($MoS_2$), and indium-silicon-zinc oxide (ISZO).

According to an embodiment of the present specification, the gate electrode and the gate line may include at least one selected from a group consisting of Cu, W, Mo, Al, Al—Nd, Ag, Au, Ti, TiN, Cr, Ta, and Mo—Ti. Further, the gate electrode and the gate line may be a stacking structure of two layers or more.

According to an embodiment of the present specification, the source electrode and the data line may include at least one selected from the group consisting of Cu, W, Mo, Al, Al—Nd, Ag, Au, Ti, TiN, Cr, Ta, and Mo—Ti. Further, the source electrode and the data line may be the stacking structure of two layers or more.

According to an embodiment of the present specification, the drain electrode may include at least one selected from the group consisting of Cu, W, Mo, Al, Al—Nd, Ag, Au, Ti, TiN, Cr, Ta, and Mo—Ti. Further, the drain electrode may be the stacking structure of two layers or more.

An embodiment of the present specification provides a display device including the thin-film transistor substrate.

Hereinafter, the present invention will be described in more detail with reference to Examples. However, the following Examples are used just for exemplifying the present invention and are not used for limiting the scope of the present invention.

Example 1

A MoTi layer having a thickness of 30 nm was formed by a sputtering method using a MoTi (50:50 at %) alloy target on a glass substrate, a MoTi oxynitride layer having a thickness of 40 nm was formed on the top of the MoTi layer by a reactive sputtering method by using a MoTi (50:50 at %) target. The reflectance of the deposited film was 9.4%.

In order to obtain the light absorption coefficient (k) value, a single layer of MoTi oxynitride was formed on a glass substrate in the same manner as described above. Then, the refractive index and the light absorption coefficient were measured using an ellipsometer. The values of n, k at wavelengths of 380 to 1000 nm are shown in FIG. 3, and the value of the light absorption coefficient at 550 nm is 0.43. When the n and k values and the light absorption coefficient value are substituted into Equation 1, a result value is calculated as 0.031.

Examples 2 to 12

In the case of Examples 2 to 12, an optical simulation was performed through MacLeod program. An optical constant value of Example 1 is substituted into the program and a reflectance value is obtained when the MoTi oxynitride layer has each thickness and the value is shown in Table 1 given below.

TABLE 1

| | Thickness (nm) of MoTi oxynitride layer | Value of Equation 1 | Reflectance (%) |
|---|---|---|---|
| Example 2 | 5.5 | 0.0043 | 52 |
| Example 3 | 10 | 0.0078 | 46 |
| Example 4 | 15 | 0.0117 | 39 |
| Example 5 | 20 | 0.0156 | 31 |
| Example 6 | 25 | 0.0195 | 23 |
| Example 7 | 30 | 0.0235 | 18 |

TABLE 1-continued

| | Thickness (nm) of MoTi oxynitride layer | Value of Equation 1 | Reflectance (%) |
|---|---|---|---|
| Example 8 | 35 | 0.0274 | 14 |
| Example 9 | 60 | 0.0469 | 17 |
| Example 10 | 70 | 0.0547 | 23 |
| Example 11 | 80 | 0.0625 | 27 |
| Example 12 | 100 | 0.078 | 31 |

Comparative Example 1

The MoTi layer having the thickness of 30 nm was formed on the glass substrate by the sputtering method using the MoTi (50:50 at %) alloy target. The reflectance of the deposited film was 52%. To obtain the light absorption coefficient (k) value, a single layer of MoTi was formed on the glass substrate in the same manner as described above. Then, the refractive index and the light absorption coefficient were measured using the ellipsometer. The values of n, k at wavelengths of 380 to 1000 nm are shown in FIG. 4, and the value of the light absorption coefficient at 550 nm is 3.18. When the n and k values and the light absorption coefficient value are substituted into Equation 1, the result value is calculated as 0.23. A graph showing comparison of the reflectance of Example 1 and the reflectance of Comparative Example 1 is illustrated in FIG. 5.

Comparative Example 2

The procedure was performed similarly to Example 1 except that the thickness of the MoTi oxynitride layer is set to 4 nm. The value of Equation 1 is calculated as 0.003. The reflectance was 53%.

Example 13

A Cu layer having a thickness of 60 nm was formed on the glass substrate with a conductive layer by a DC sputtering method using a Cu single target and a light reflection reduction layer including $MoTi_aN_xO_y$ ($0<a\leq2$, $0<x\leq3$, $0<y\leq2$) having a thickness of 35 nm was formed by a reactive DC sputtering method by using the MoTi (50:50 at %) alloy target. The total reflectance depending on the wavelength was measured using a Solidspec 3700 (UV-Vis spectrophotometer, Shimadzu) and the result is illustrated in FIG. 6. The value of Equation 1 of the light reflection reduction layer was 0.059.

Example 14

The Cu layer having the thickness of 60 nm was formed on the glass substrate with a first conductive layer by the DC sputtering method using the Cu single target and a MoTi layer having a thickness of 20 nm was formed with a second conductive layer by the DC sputtering method by using the MoTi(50:50 at %) alloy target, and the light reflection reduction layer including $MoTi_aN_xO_y$ ($0<a\leq2$, $0<x\leq3$, $0<y\leq2$) and having the thickness of 35 nm was formed by the reactive DC sputtering method by using the same target. The total reflectance depending on the wavelength was measured using a Solidspec 3700 (UV-Vis spectrophotometer, Shimadzu) and the result is illustrated in FIG. 7. The value of Equation 1 of the light reflection reduction layer was 0.059.

Example 15

Except that the Al layer deposited with Al instead of the MoTi layer was used and the aluminum oxynitride (k=1.24) was used instead of the MoTi oxynitride to form the layer with a thickness of 87 nm, Example 15 was performed similarly to Example 1. In this case, the value of Equation 1 was 0.2 and the reflectance was 28% or less. FIGS. 8 and 9 illustrate reflectance and an optical constant value implemented in the structure.

Through an experimental result of the Examples and the Comparative Examples, it can be verified that an effect of an excellent light reflection reduction layer may be shown in the structure disclosed in the claims of the present invention.

SEQUENCE LIST TEXT

101a, 101b: Gate line
201, 201a, 201b: Data line
301: Thin-film transistor
310: Gate electrode
320: Semiconductor layer
330: Source electrode
340: Drain electrode
401: Substrate
801: Light reflection reduction layer
1010: Insulating layer

The invention claimed is:

1. A thin-film transistor substrate comprising:
   a substrate;
   multiple gate lines and multiple data lines provided on the substrate to cross each other;
   a thin-film transistor comprising a gate electrode connected with the gate line, a semiconductor layer provided on the gate electrode to be insulated from the gate electrode, a source electrode electrically connected with the data line, and a drain electrode; and
   a light reflection reduction layer provided on a plane of the gate electrode, the source electrode, the drain electrode, the gate line, and the data line facing the substrate; and a plane opposite to the plane of the gate electrode, the source electrode, the drain electrode, the gate line, and the data line facing the substrate,
   wherein in the light reflection reduction layer, a value of Equation 1 given below satisfies the range of 0.004 to 0.22;

$$\frac{(k \times t)}{\lambda} \quad \text{[Equation 1]}$$

in the Equation 1, k represents an extinction coefficient of the light reflection reduction layer, t represents a thickness of the light reflection reduction layer, and λ represents a wavelength of light.

2. The thin-film transistor substrate of claim 1, wherein the thickness of the light reflection reduction layer is in the range of 10 nm to 100 nm.

3. The thin-film transistor substrate of claim 1, wherein the extinction coefficient k of the light reflection reduction layer is in the range of 0.1 to 2 in light having a wavelength of 550 nm.

4. The thin-film transistor substrate of claim 1, wherein a refractive index n of the light reflection reduction layer is in the range of 2 to 3 in the light having the wavelength of 550 nm.

5. The thin-film transistor substrate of claim 1, wherein light reflectance of an electrode having the light reflection reduction layer is 50% or less.

6. The thin-film transistor substrate of claim 1, wherein the light reflection reduction layer includes at least one selected from a group consisting of metal oxide, metal nitride, and metal oxynitride.

7. The thin-film transistor substrate of claim 6, wherein the metal oxide, the metal nitride, and the metal oxynitride are derived from one or two or more metals selected from a group consisting of Cu, Al, Mo, Ti, Ag, Ni, Mn, Au, Cr, and Co.

8. A display device comprising the thin-film transistor substrate of claim 1.

* * * * *